(12) United States Patent
Hung

(10) Patent No.: US 8,159,271 B2
(45) Date of Patent: Apr. 17, 2012

(54) SCAN DRIVER

(75) Inventor: Ching-Ho Hung, Hsinchu (TW)

(73) Assignee: Novtek Microelectronics Corp., Hsinchu (TW)

( * ) Notice: Subject to any disclaimer, the term of this patent is extended or adjusted under 35 U.S.C. 154(b) by 412 days.

(21) Appl. No.: 12/271,063

(22) Filed: Nov. 14, 2008

(65) Prior Publication Data
US 2009/0276668 A1     Nov. 5, 2009

(30) Foreign Application Priority Data
May 5, 2008   (TW) .............................. 97116542 A

(51) Int. Cl.
*H03K 19/094*   (2006.01)
(52) U.S. Cl. .......... 326/112; 326/105; 326/119; 326/62; 326/63; 345/100; 365/185.05
(58) Field of Classification Search .............. 326/81–83, 326/86–87, 102, 104–108, 119, 121; 345/55, 345/82–83, 87–104, 204–205
See application file for complete search history.

(56) References Cited

U.S. PATENT DOCUMENTS

| 5,657,040 | A * | 8/1997 | Kanbara | 345/98 |
| 6,177,920 | B1 * | 1/2001 | Koyama et al. | 345/100 |
| 7,443,376 | B2 * | 10/2008 | Suzuki | 345/100 |

* cited by examiner

*Primary Examiner* — Shawki S Ismail
*Assistant Examiner* — Christopher Lo
(74) *Attorney, Agent, or Firm* — Rabin & Berdo, P.C.

(57) ABSTRACT

A scan driver includes a voltage setting circuit, a counter circuit, a logic circuit, a dynamic decoder, N level shift circuits and N output stage circuits, wherein N is a natural number. The voltage setting circuit sets N voltage signals to a first level. The counter circuit provides count data to the logic circuit, which generates M control signals according to the count data, wherein M is a natural number. The dynamic decoder includes multiple transistors, arranged in N rows, for receiving the respective N voltage signals. The transistors are further arranged in M columns and are controlled by the respective M control signals to determine levels of the N voltage signals. The N level shift circuits lift the levels of the respective N voltage signals, and the N output stage circuits output respective N gate signals based on the N voltage signals whose levels are shifted.

14 Claims, 10 Drawing Sheets

SCAN DRIVER

This application claims the benefit of Taiwan application Serial No. 97116542, filed May 5, 2008, the subject matter of which is incorporated herein by reference.

BACKGROUND OF THE INVENTION

1. Field of the Invention

The invention relates in general to a scan driver, and more particularly to a scan driver implemented using a counter and a decoder.

2. Description of the Related Art

In the modern age, in which the technological development changes with each passing day, liquid crystal displays have been widely applied to various electronic display products, such as a television, a computer display, a notebook computer, a mobile telephone and a personal digital assistant. The liquid crystal display includes a data driver, a scan driver and a liquid crystal display panel. The liquid crystal display panel has a pixel array, and the scan driver sequentially opens multiple pixel rows in the pixel array to scan pixel data, outputted from the data driver, to the pixels and thus to display the to-be-displayed image.

The technique of implementing the scan driver using a counter in conjunction with a decoder has existed. Conventionally, a static decoder is usually provided to implement the scan driver. However, the static decoder disadvantageously has the larger circuit area and the higher cost. So, it is an important direction of the industry to design a shift resister having the smaller area and the lower cost.

SUMMARY OF THE INVENTION

The invention is directed to a scan driver, which advantageously has the smaller circuit area and the lower cost than those of a conventional scan driver.

According to a first aspect of the present invention, a scan driver including a counter circuit, a dynamic decoder, N level shift circuits and N output stage circuits is provided. The counter circuit generates count data, which includes K bit data. A value of the count data is increased by 1 or a changed every second fixed period, wherein K is a natural number. A first logic circuit receives the K bit data and correspondingly generates M first control signals, wherein M is a natural number greater than K. The dynamic decoder includes a voltage setting circuit and multiple first transistors. The voltage setting circuit substantially sets N first voltage signals on N nodes to a first level in a voltage setting period. The multiple first transistors are arranged to form N rows of transistor circuits. The N rows of transistor circuits are connected to the respective N nodes. The first transistors are further arranged to form M columns of transistor circuits. In a value determining period, the M columns of transistor circuits are controlled by the M respective first control signals to determine levels of the N first voltage signals, wherein N is a natural number. The N level shift circuits lift the levels of the respective N first voltage signals to generate N second voltage signals. The N output stage circuits receive the N respective second voltage signals and respectively output N gate signals.

According to a second aspect of the present invention, a scan driver including a counter circuit, a dynamic decoder and N output stage circuits is provided. The counter circuit generates count data including K bit data. A value of the count data is increased by 1 or a count value of the count data is changed every second fixed period, wherein K is a natural number. A first logic circuit receives the K bit data, and correspondingly generates M first control signals. The first logic circuit further lifts levels of the M first control signals to generate M second control signals. The dynamic decoder includes a voltage setting circuit and multiple first transistors. The voltage setting circuit substantially sets N first voltage signals on N nodes to a first level in a voltage setting period. The multiple first transistors are arranged to form N rows of transistor circuits. The N rows of transistor circuits are connected to the respective N nodes. The first transistors are further arranged to form M columns of transistor circuits. In a value determining period, the M columns of transistor circuits are controlled by the respective M second control signals to determine levels of the N first voltage signals, wherein N is a natural number. The N output stage circuits receive the respective N first voltage signals and output N respective gate signals.

The invention will become apparent from the following detailed description of the preferred but non-limiting embodiments. The following description is made with reference to the accompanying drawings.

DETAILED DESCRIPTION OF THE INVENTION

Each embodiment of the invention provides a scan driver implemented by a dynamic decoder in conjunction with a counter circuit.

First Embodiment

Figure 1:
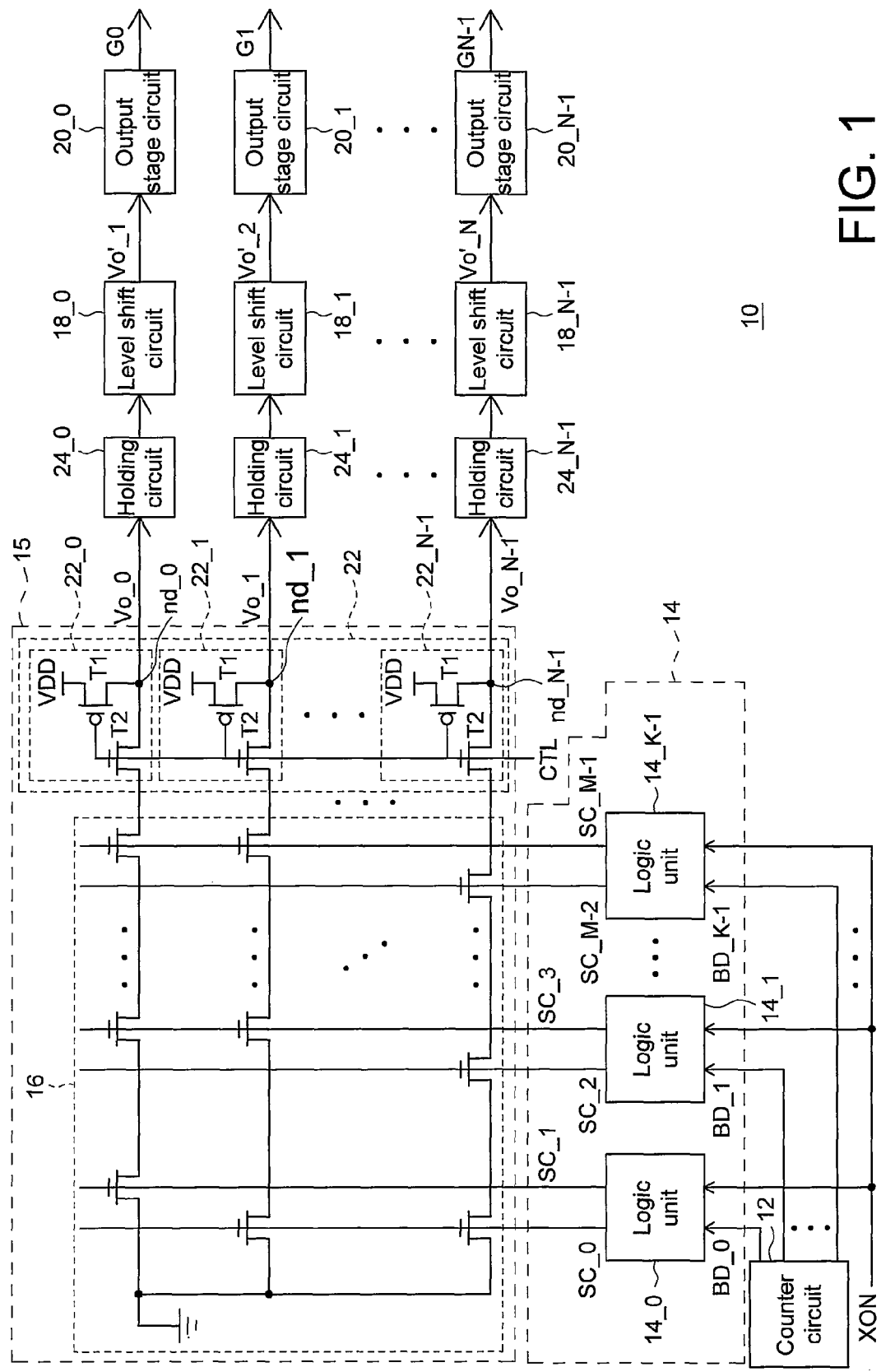
FIG. 1 is a block diagram showing a scan driver according to the first embodiment of the invention.

This embodiment provides a scan driver implemented by a dynamic decoder of an NAND-plane circuit manufactured by low-voltage manufacturing processes. FIG. 1 is a block diagram showing a scan driver 10 according to the first embodiment of the invention. Referring to FIG. 1, the scan driver 10 includes a counter circuit 12, a logic circuit 14, a dynamic decoder 15, level shift circuits 18_0 to 18_N−1, output stage circuits 20_0 to 20_N−1 and holding circuits 24_0 to 24_N−1, wherein N is a natural number. The dynamic decoder 15 includes an NAND-plane circuit 16 and a voltage setting circuit 22.

Figure 2:
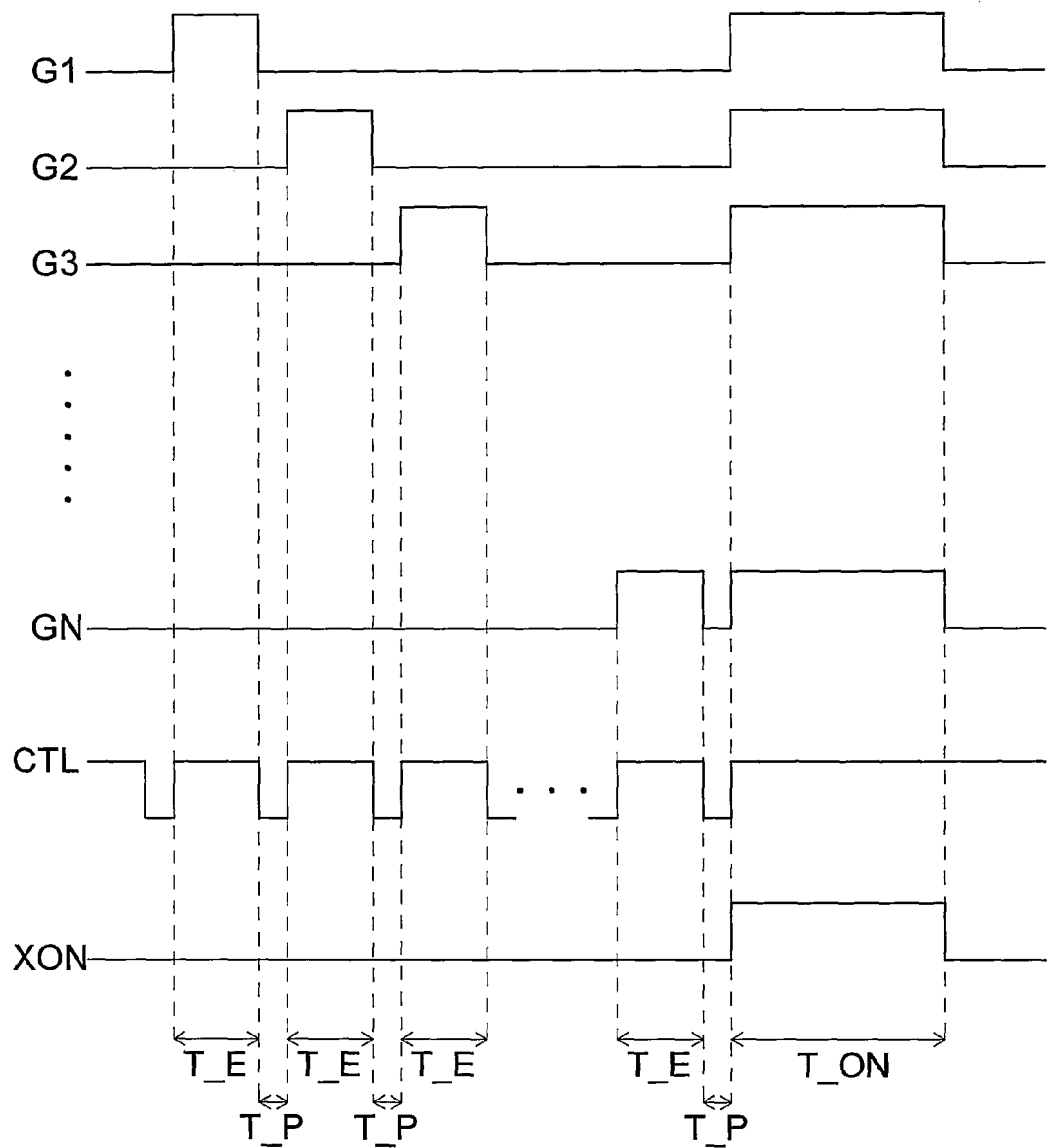
FIG. 2 shows an operation timing chart of the scan driver of FIG. 1.

FIG. 2 shows an operation timing chart of the scan driver of FIG. 1. As shown in FIG. 2, the operation timings of the scan driver 10 mainly fall within a precharge period T_P and an evaluation period T_E. In the precharge period T_P, the voltage setting circuit 22 sets voltage levels of nodes nd_0 to nd_N−1 so that voltage signals Vo_1 to Vo_N−1 on the nodes nd_0 to nd_N−1 are equal to a first level. In the evaluation period T_E, the counter circuit 12 generates count data including K bit data BD_0 to BD_K−1. The logic circuit 14 generates M control signals SC_0 to SC_M−1 according to the bit data BD_0 to BD_K−1. The M control signals SC_0 to SC_M−1 control N rows of transistors of the NAND-plane circuit 16 to equivalently form N level control circuits to respectively control levels of voltages Vo_0 to Vo_N−1 in the evaluation period T_E, wherein M, N and K are natural numbers. For example, M is equal to 2K, N is equal to $2^K$. Next, the operation of the scan driver 10 will be further described according to an example, in which K, M and N are respectively equal to 8, 16 and 256.

The voltage setting circuit 22 includes N(=256) voltage setting units 22_0, 22_1, 22_2, . . . , and 22_N−1(=255), which are respectively for setting the levels of the voltage signals Vo_0 to Vo_N−1(=255) to the first level in the precharge period T_P. The first level is, for example, equal to a level VDD of a highest voltage of the scan driver 10. The voltage setting units 22_0 to 22_255 have the similar circuit structures and operations. Next, the operations of other voltage setting units will be described by taking an $i^{th}$ voltage setting unit 22_i as an example, wherein "i" is an integer greater than or equal to 0 and smaller than N(=256).

The voltage setting unit 22_i includes transistors T1 and T2. The transistor T1 has a first input terminal for receiving the level VDD, a second input terminal connected to the node nd_i, and a control terminal for receiving a control signal CTL. In the precharge period T_P, the transistor T1 is enabled by the control signal CTL to make the level of the voltage signal Vo_i equal to the level VDD. For example, the control signal CTL is low in the precharge period T_P, and the transistor T1 is a P-type metal oxide semiconductor (PMOS) transistor so that the transistor T1 is enabled by the low control signal CTL in the precharge period T_P.

The transistor T2 has a first input terminal connected to the node nd_i, a second input terminal connected to an output terminal of an $i^{th}$ row of transistors of the NAND-plane circuit 16, and a control terminal for receiving the control signal CTL. In the precharge period T_P the transistor T2 is disabled by the control signal CTL. At this time, the transistor T1 can provide the level VDD as the voltage signal Vo_i. In the evaluation period T_E, the transistor T2 is enabled by the control signal CTL. At this time, the output terminal of the $i^{th}$ row of transistors is connected to the node nd_i, and the $i^{th}$ row of transistors can correspondingly control the level of the voltage Vo0_i. The transistor T2 is an N-type metal oxidation semiconductor (NMOS) transistor so that it can be enabled by the high control signal CTL in the evaluation period T_E.

Figure 3:
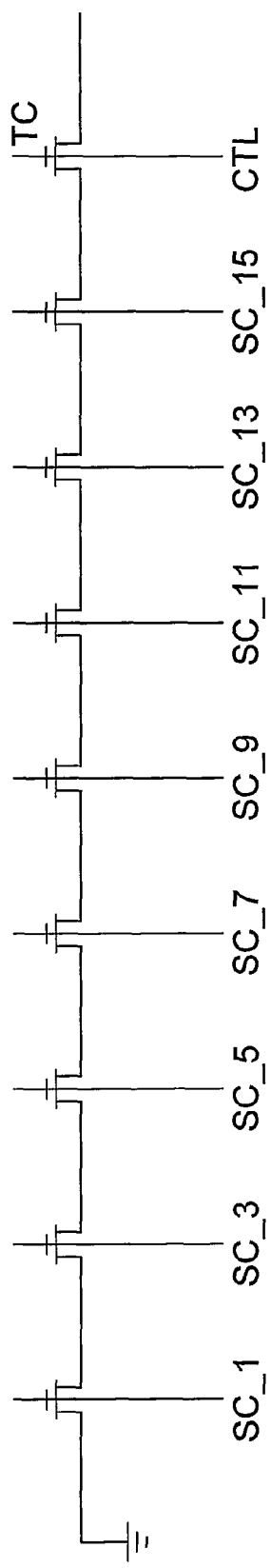
FIG. 3 is a circuit diagram showing a zeroth row of transistors in a dynamic decoder 15 of FIG. 1.

As shown in FIG. 3, if the node nd_i is a drain of a transistor SC_15, the transistor T2 may be any NMOS transistor in the $i^{th}$ string of NAND circuits. That is, any one of the transistors correspondingly controlled by the control signals SC_1, SC_3, . . . , and SC_15 in FIG. 3 may serve as the transistor T2.

Other voltage setting units in the voltage setting circuit 22 of FIG. 1 and the voltage setting unit 22_i have substantially the same structure so as to control the levels of the corresponding voltage signals to be equal to the level VDD in the precharge period T_P, and to respectively make the output terminals of 256 rows of transistors of the NAND-plane circuit 16 be respectively short-circuited to the nodes nd_1 to nd_255 in the evaluation period T_E.

The counter circuit 12 is for generating the desired count data in the evaluation period T_E. Taking an ascending counter as an example, the counter circuit 12 generates the count data having the initial values equal to 0, and increases the count data by 1 or changes the count data every second fixed period. When the value of the count data reaches the number N, the counter circuit 12 resets the value of the count data to 0 before starting the next count and performs the count operation again. Consequently, the counter circuit 12 can sequentially output the count data having the values equal to 0 to 255 during or before continuous N evaluation periods T_E.

The count data includes K(=8) bit data BD_1 to BD_K−1 (=7), which are respectively the least significant bit (LSB) data, the second least significant bit data, . . . , and the most significant bit (MSB) data of the count data. In this embodiment, the counter circuit 12 outputs the count data having the Gray code format, for example.

The logic circuit 14 generates M(=16) control signals SC_0 to SC_M−1(=15) in response to the bit data BD_0 to BD_7 and respectively controls the operations of 16 columns of transistors of the NAND-plane circuit 16 according to the control signals SC_0 to SC_15, wherein whether transistors exist or not in each column is evaluated according to the decoding condition. The logic circuit 14 includes K(=8) logic units 14_0 to 14_K−1(=7), and the logic units 14_0 to 14_7 are glue logic circuits, for example. The logic units 14_0 to 14_7 have substantially similar operations. Next, illustrations will be made by taking the operation of the $j^{th}$ logic circuit 14_j as an example, wherein "j" is an integer greater than or equal to 0 and smaller than K(=8).

The logic circuit 14_j receives the bit data BD_j and outputs the data of the bit data BD_j and the inverse data of the bit data BD_j as the respective control signals SC_2j and SC_2j+1, respectively. For example, "j" is equal to 0, the logic circuit 14_1 receives the bit data BD_0, and outputs the bit data BD_0 and the inverse data of the bit data BD_0 as the control signals SC_0 and SC_1, respectively. The logic circuit 14_0 further respectively outputs the control signals SC_0 and SC_1 to the first and second columns of transistors of the M columns of transistors to respectively control the operations thereof.

The other logic circuits 14_1 to 14_7 perform the operations substantially similar to that of the logic circuit 14_0 to respectively provide the bit data BD_1 to BD_7 as the control signals SC_2, SC_4, SC_6, SC_8, SC_10, SC_12 and SC_14, and to respectively provide inverse signals of the bit data BD_2 to BD_7 as the control signals SC_3, SC_5, SC_7, SC_9, SC_11, SC_13 and SC_15.

The NAND-plane circuit 16 may be implemented using various circuit structures. In this illustrated embodiment, all transistors are NMOS transistors, and each of the N rows of transistors is constructed with an NAND circuit structure. Each of the N(=256) rows of transistors includes K transistors connected in series, and the serially connected circuit of the K transistors has one end formed into the output terminal of each of the N rows of transistors, and the other end for receiving a second level, which is a grounding level, for example. Because the rows of transistors have substantially similar operations, only the $x^{th}$ row of transistors of the N rows of transistors is illustrated, wherein x is an integer greater than or equal to 0 and smaller than 256.

The NAND-plane circuit is normally implemented by N-type MOS. It could be changed to be implemented by P-type MOS with logical changed too. Or the NAND-plane can be said as the serial connection with a plurality of transistors.

The $x^{th}$ row of transistors includes 8 transistors, one transistor for precharge, and one transistor serving as a evaluation switch, which is controlled by 8 control signals of the control signals SC_0 to SC_255 to turn on or off in the evaluation period T_E. The $x^{th}$ row of transistors forms a grounding path when the value of the count data is equal to x so as to pull the level of the node nd_xdown to the grounding level. When the value of the count data is not equal to x, the $x^{th}$ row of transistors forms an open-circuit path. Therefore, the level of the node nd_x remains at the level VDD, at which the node nd_x is set in the precharge period T_P. So, the level of the node nd_x is continuously kept at the level VDD.

For example, "x" is equal to 0, and the zeroth row of transistors forms a short-circuit path when the value of the count data is equal to $[00000000]_2$. The serially connected transistors of the zeroth row of transistors include transistors whose gates receive the inverse data of the bit data BD_0 to BD_7. That is, the zeroth row of transistors includes eight transistors, which have gates for receiving the control signals SC_1, SC_3, SC_5, SC_7, SC_9, SC_11, SC_13 and SC_15, and form a serially connected circuit, as shown in FIG. 3. Consequently, the zeroth row of transistors pulls the level of the node nd_0 down to the grounding level when the value of the count data is equal to 0 and CTL turns on the transistor T2.

The above-mentioned description is made only according to the example, in which "x" is equal to 0. However, when "x" is equal to another value ranging from 1 to 255, the corresponding first to $255^{th}$ rows of transistors may also execute the operations substantially similar to those of the zeroth row of transistors so as to pull the levels of the nodes nd_1 to nd_255 down to the grounding level correspondingly. As can be understood from that above-mentioned description, only one voltage signal is in the grounding level in one evaluation period T_E. In addition, when the value of the count data is increased by 1 every second fixed period, the voltage signals Vo_0 to Vo_255 are sequentially in the grounding level in 255 continuous evaluation periods T_E.

The level shift circuits 18_0 to 18_N−1(=255) respectively convert the voltage signals Vo_0 to Vo_255 on the nodes nd_0 to nd_255 to lift the levels of the voltage signals Vo_0 to Vo_255 and to correspondingly obtain the voltage signals Vo'_0 to Vo'_255. The output stage circuits 20_0 to 20_N−1 (=255) respectively output scan signals G0 to G255 according to the lifted levels of the voltage signals Vo'_0 to Vo'_255. The scan signals G0 to G255 are, for example, high level enable signals. The output stage circuits 20_0 to 20_255 have the ability of providing inversed output signals, and substantially respectively output the inverse signals of the voltage signals Vo'_0 to Vo'_255 as the scan signals G0 to G255. The level shift circuits 18_0 to 18_255 and the output stage circuits 20_0 to 20_255 are circuits formed by high-voltage manufacturing processes.

In the scan driver 10 of this embodiment, the scan signals G0 to G255 are generated using the dynamic decoder 15, which has the NAND-plane circuit 16 and the voltage setting circuit 22, in conjunction with the counter circuit 12. Compared with the conventional scan driver, the scan driver 10 of this embodiment advantageously has the fewer transistors for the decoder, the smaller circuit area and the lower cost.

In addition, the NAND-plane circuit 16 and the voltage setting circuit 22 according to this embodiment are substantially a serially connected circuit composed of multiple NMOS transistors. Consequently, two adjacent transistors connected in series can share the source and the drain when the circuit layout is being made. Thus, the circuit sizes of the scan driver 10 and the dynamic decoder 15 according to this embodiment may be further reduced.

In addition, the count data of this embodiment has the Gray code format. So, the value of one bit data is changed at a time when the count data is ascended. Thus, the logic circuit 14 only has to correspondingly adjust the levels of two control signals in any value ascending period of the count data. For example, when the count data is changed from the value 2 to the value 3, only the bit data BD_0 is changed from the value 1 to the value 0. The logic circuit 14 only has to correspondingly adjust the control signal SC_0(=the bit data BD_0) from the value 1 to the value 0, and adjust the control signal SC_1 (=the inverse data of the bit data BD_0) from the value 0 to the value 1. Consequently, it is possible to reduce the electrical power to be consumed when the logic circuit 14 controls the NAND-plane circuit 16.

In this embodiment, the control signal CTL is, for example, a gate output enable (GOE) signal of the scan driver 10, which is low in the precharge period T_P such that the scan driver 10 stops outputting the scan signals G0 to G255. The GOE signal is further in the high level in the evaluation period T_E in order to enable the scan driver 10 to output the scan signals G0 to G255.

In this scan driver 10 of this embodiment, a feedback path is further configured in the holding circuits 24_0 to 24_N−1 (=255) to hold the levels of the voltage signals Vo'_0 to Vo'_255, and to prevent the error from being generated when the levels of the voltage signals Vo'_0 to Vo'_255 are influenced by the dynamic leakage. For example, the high voltage signal Vo'_1 will be lowered, by the parasitic grounding path in the circuit, to the level close to the ground level in the precharge period T_P. Because the holding circuits 24_0 to 24_255 have substantially the same design, only the output terminal circuit 24_y is described in the following example, wherein "y" is an integer greater than or equal to 0 and smaller than 256.

Figure 4:
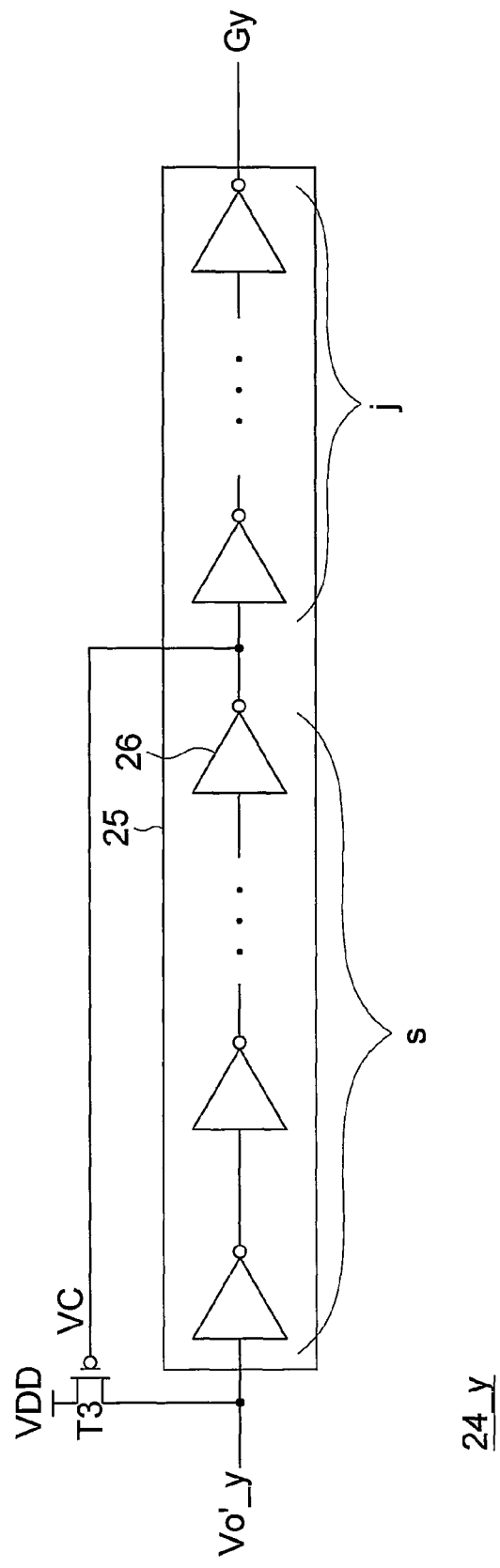
FIG. 4 is a circuit diagram showing a holding circuit 24_y of FIG. 1.

FIG. 4 is a circuit diagram showing the holding circuit 24_y of FIG. 1. Referring to FIG. 4, the holding circuit 24_y includes an inverter serial connection circuit 25 and a transistor T3. The inverter serial connection circuit 25 is composed of t(t=s+j) stages of inverters connected in series and has an input terminal for receiving a voltage signal Vo_y provided by a $y^{th}$ sting of NAND circuits, and an output terminal for providing the input signal of the level shift circuit. In this example, a feedback path VC is connected to the gate of the transistor T3, wherein VC is the output of the $s^{th}$ stage of inverter, "s" must be an odd number, and the control signal VC is the inverse signal of the voltage signal Vo'_y. Whether "t" is an odd number or not is determined by the phase difference between the output signal and the input signal of the output stage.

In the precharge period T_P, the transistor T3 is continuously turned on by the low control signal VC so that the voltage signal Vo_y can be continuously held at the high level. The holding circuit 24_y and the other holding circuits 24_0 to 24_N−1 also have substantially similar structures and operations so that the level of the corresponding voltage signal is held at the high level in the precharge period T_P.

Figure 11:
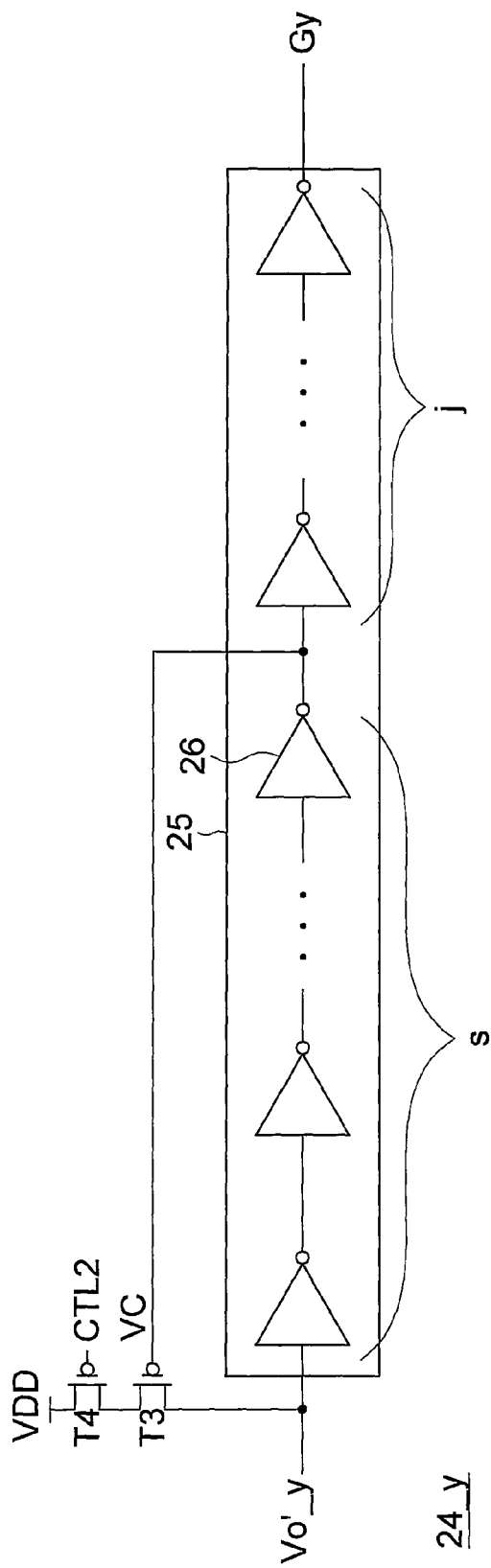
FIG. 11 is another circuit diagram showing the holding circuit 24_y of FIG. 1.
Figure 14:
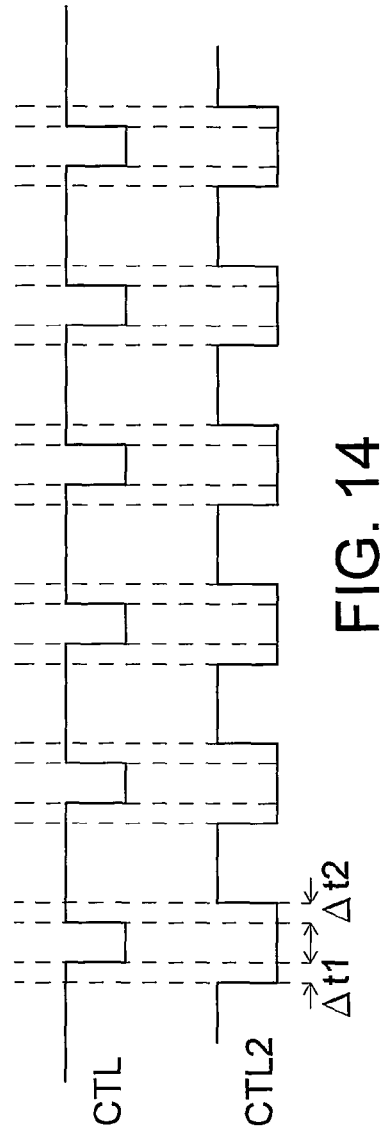
FIG. 14 is a timing chart showing associated control signals CTL and CTL2 according to the first embodiment of the invention.

Similarly, FIG. 4 is modified into FIG. 11 to form a preferred embodiment, in which a pull-up control switch T5 is added, and the on/off state thereof is determined by a control signal CTL2. The timing charts of CTL2 and CTL are shown in FIG. 14, wherein CTL2 and CTL do not overlap with each other according to the key feature:

$$\Delta t2 > 0.$$

Thus, it is possible to prevent the instantaneous DC current loss caused when Vo_y is changed from the high potential to the low potential.

The logic unit, such as one of 14_0 to 14_K in FIG. 1, according to this embodiment further receives a control signal XON (one application function of the scan driver), and controls all the transistors in the NAND-plane circuit 16 to turn on in response to the control signal XON, and thus to pull the levels of the voltage signals Vo_0 to Vo_N−1(=255) down to the grounding level in an all-on period T_ON. The signal waveform of the control signal XON is shown in FIG. 2. Thus, it is possible to obtain the scan signals G0 to GN−1(=255), which are simultaneously at the high levels, and thus to obtain the scan signals G0 to G255, all of which are enabled. Consequently, the scan driver 10 of this embodiment may have the all-on function of totally enabling the scan signals G0 to G255.

In this illustrated embodiment, the scan driver 10 of FIG. 1 turns on all the transistors of the NAND-plane circuit 16 and the voltage setting circuit 22 via the logic units 14_0 to 14_K so that the scan signals G0 to G255 are in the high level simultaneously. However, the scan driver 10 of this embodiment is not restricted to the adopted circuit design, and further may achieve substantially the same operation via other types of circuit designs.

For example, it is also possible to design a function circuit in each of the voltage setting units 22_0 to 22_255 to respectively pull the corresponding voltage signals Vo_0 to Vo_255 down to the grounding level in response to the control signal XON. Thus, the all-on scan signals G0 to G255 may be generated. Because the function circuits in the voltage setting units 22_0 to 22_255 have substantially the same structure and operation, so the function circuit in the voltage setting unit 22_u will be illustrated as an example in the following, wherein "u" is an integer greater than or equal to 0 and smaller than 256.

Figure 5:
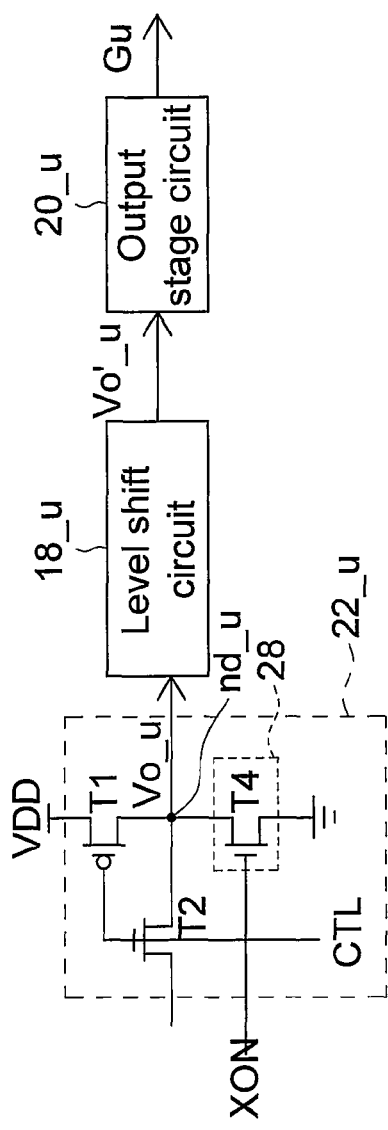
FIG. 5 is a circuit diagram showing a function circuit showing a voltage setting unit 22_u.

FIG. 5 is a circuit diagram showing a function circuit 28 showing the voltage setting unit 22_u. Referring to FIG. 5, the function circuit 28 includes a transistor T4, which has a first terminal connected to the node nd_u, a second terminal for receiving the grounding level, and a control terminal for receiving the control signal XON. The transistor T4 may be, for example, an NMOS transistor, which turns on in response to the high control signal XON to pull the level of the voltage signal Vo_u down to the grounding level. Consequently, the voltage signal Vo_u may also be effectively controlled to be equal to the grounding level via the transistor T4 and enables the scan signal Gu. The function circuit in each of other voltage setting units may also execute substantially the same operation as the function circuit 28 to pull all the voltage signals Vo_0 to Vo_255 down to the grounding level, and to enable all the scan signals G0 to G255.

In this illustrated embodiment, the count data has the Gray code format. However, the count data is not restricted to the Gray code format, and may also have any other binary data format.

In this illustrated embodiment, the transistors in the NAND-plane circuit 16 and the voltage setting circuit 22 are arranged to form N rows of transistors, as shown in FIG. 1, and each of the N rows of transistors substantially has the NAND circuit structure. However, the transistors in the NAND-plane circuit 16 and the voltage setting circuit 22 are not restricted to be arranged in N rows, and the circuit structures of the NAND-plane circuit 16 and the voltage setting circuit 22 may further be simplified via various circuit design skills.

Figure 6:
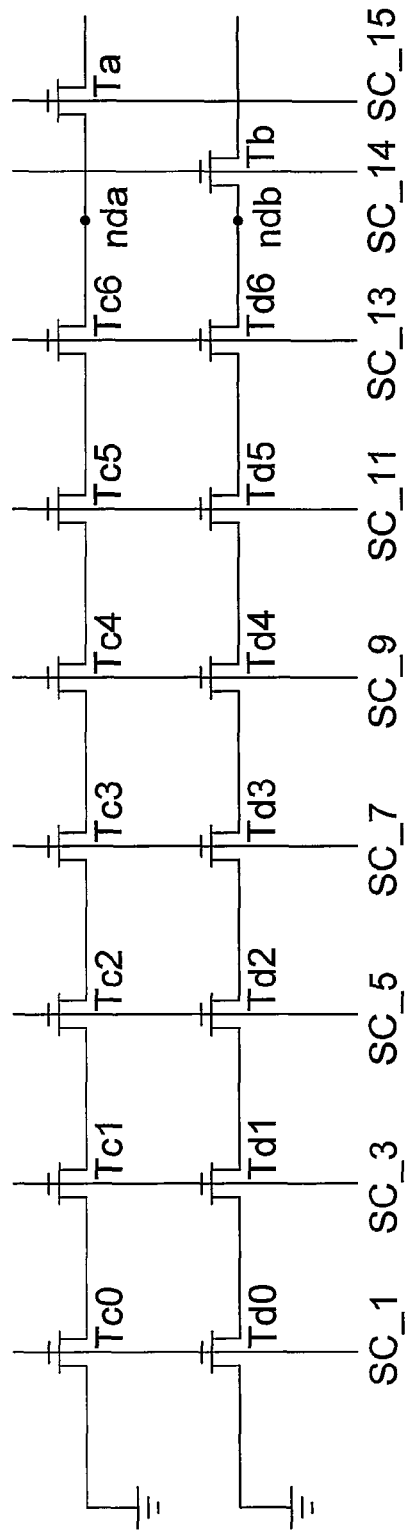
FIG. 6 is a circuit diagram showing a zeroth row of transistors and a first row of transistors in an NAND-plane circuit 16 of FIG. 1.

In one example, adjacent two rows of transistors in the NAND-plane circuit 16 and the voltage setting circuit 22 have similar circuit structures. Thus, it is possible to further simplify the circuit structures of the NAND-plane circuit 16 and the voltage setting circuit 22 by sharing some transistor circuits in two rows of transistors in the NAND-plane circuit 16 and the voltage setting circuit 22. For example, the difference between the circuit structures of the zeroth and first rows of transistors in the NAND-plane circuit 16 is that the transistors receiving the grounding level are the transistors Ta and Tb respectively controlled by the control signals SC_1 and SC_0, as shown in FIG. 6. The other transistor circuits in the zeroth and first rows of transistors have the same structure, so by coupling the node nda to node ndb, the circuits of the transistors Td0 to Td6 can be omitted. Thus, the number of the transistors in the zeroth and first rows of transistors of this embodiment can be decreased to achieve substantially the same operation.

The circuit simplifying skill may also be applied to other rows of transistors in the NAND-plane circuit 16 in order to simplify the circuit structure of each row of transistors. In other examples, the similar circuit simplifying skill may also be applied to the two or more than two rows of transistors, which share the transistor circuit.

In this illustrated embodiment, the GOE signal (one of the applications of the scan driver) serves as the control signal CTL. However, the control signal CTL is not restricted to the GOE signal and may also be one of the signals generated by the other logic circuits. For example, the control signal CTL of this embodiment is preferably held at the high potential simultaneously in the all-on period of the control signal XON so as to prevent the unnecessary high current from being caused when the transistors T1 and T4 of FIG. 5 are simultaneously turned on. In this illustrated embodiment, the transistors contained in the NAND-plane circuit 16 are NMOS transistors. However, the NAND-plane circuit 16 may also be implemented by PMOS transistors.

The scan driver of this embodiment may also be implemented by the dynamic decoder, which has an NAND-plane circuit, in conjunction with the counter. Compared with the conventional scan driver, the scan driver of this embodiment advantageously has the fewer transistors for the decoder, the smaller circuit area and the lower cost.

In addition, the dynamic decoder of this embodiment is substantially a serially connected circuit composed of multiple NMOS transistors. Thus, two adjacent transistors connected in series may share the source and the drain in the layout phase so that the scan driver of this embodiment may be further reduced in size.

In addition, the count data of this embodiment has the Gray code format. So, the value of one bit data is changed at a time when the count data is ascended. Consequently, it is possible to reduce the electrical power to be consumed when the logic circuit controls the dynamic decoder so that the scan driver of this embodiment has the power-saving advantage.

Second Embodiment

Figure 7:
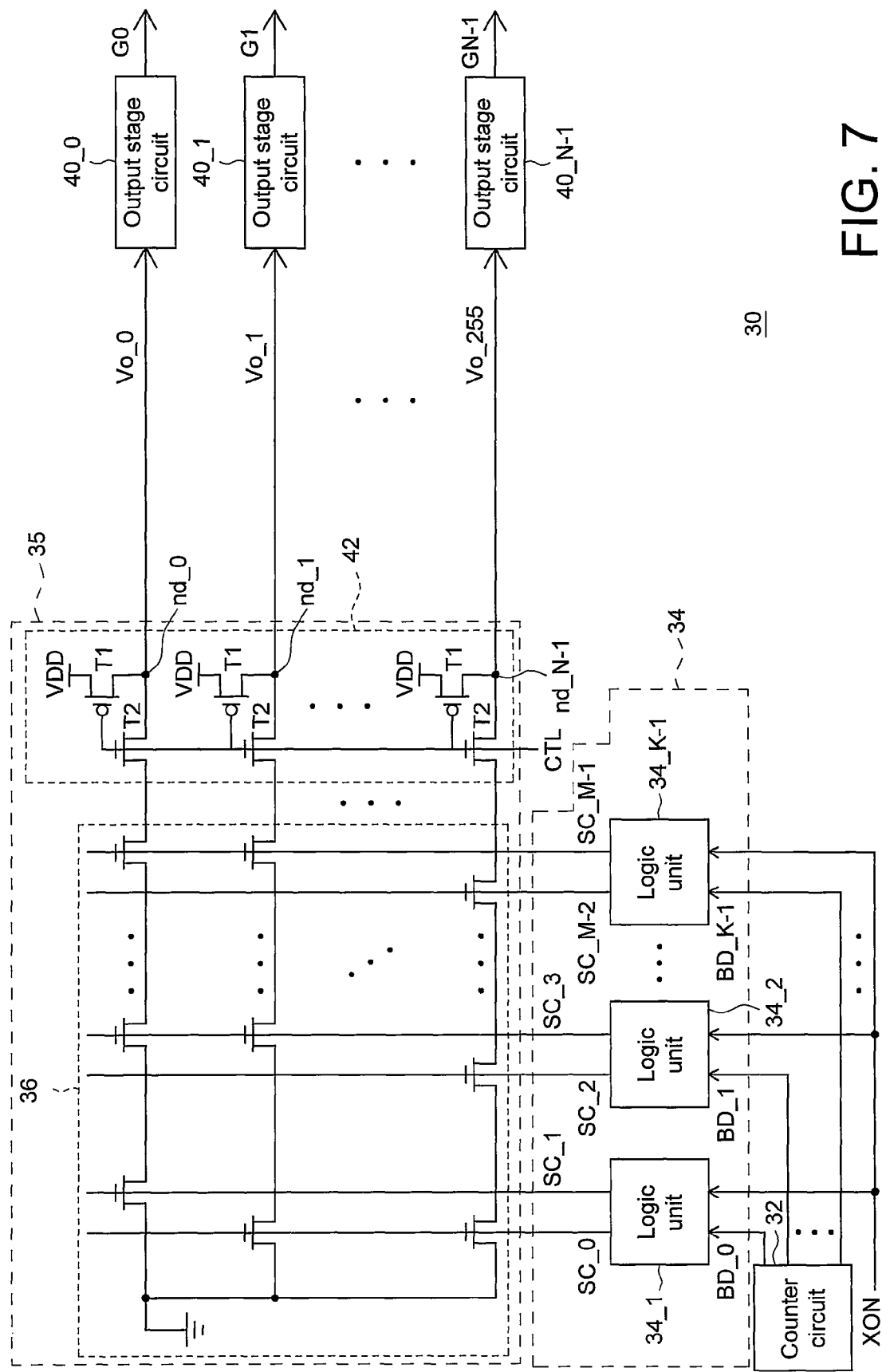
FIG. 7 is a block diagram showing a scan driver according to the second embodiment of the invention.

This embodiment provides a scan driver implemented by a dynamic decoder of an NAND-plane circuit formed by high-voltage manufacturing processes. FIG. 7 is a block diagram showing a scan driver 30 according to a second embodiment of the invention. As shown in FIG. 7, the difference between the scan driver 30 of the second embodiment and the scan driver 10 of the first embodiment is that the level shift circuits are integrated in a logic circuit 34 in the scan driver 30 of this embodiment. Consequently, the logic circuit 34, a dynamic decoder 35, which includes an NAND-plane circuit 36 and a voltage setting circuit 42, and output stage circuits 40_0 to 40_255 according to this embodiment are circuits formed by the high-voltage manufacturing processes.

In the scan driver 30 of this embodiment, the level shift circuits are disposed on an input side of the dynamic decoder 35. Consequently, the scan driver 30 of this embodiment only needs K(=8) level shift circuits for shifting the levels of the bit data BD_0 to BD_7. Compared with the scan driver 10 of the first embodiment, the number of the level shift circuits required by the scan driver 30 can be greatly decreased from the value N(=256) to K(=8). Consequently, compared with the scan driver 10 of the first embodiment, the circuit area can be further decreased in the scan driver 30 of this embodiment. Compared with the conventional scan driver, the scan driver 30 of this embodiment also advantageously has the fewer transistors for the decoder, the smaller circuit area, the lower cost and the power-saving property for the control operation of the decoder.

Figure 12:
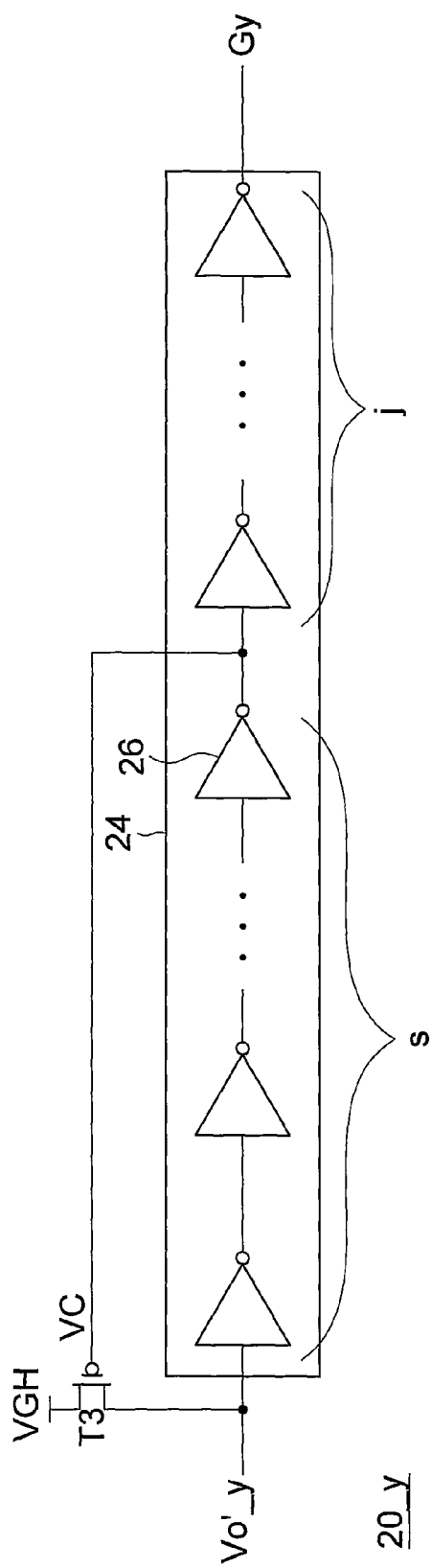
FIG. 12 is a circuit diagram showing an output stage circuit 20_y according to the second embodiment of the invention.

Because the level shift circuits are eliminated from the output of the dynamic decoder 35, the holding circuit of FIG. 1 may be combined with the output stage circuit. So, the output stage circuit is shown in FIG. 12, and the positive and negative phases of the output stage circuit may be changed according to the requirement. This embodiment adopts the inverse output stage circuit (S=1, J=0) to reduce the number of elements.

Figure 13:
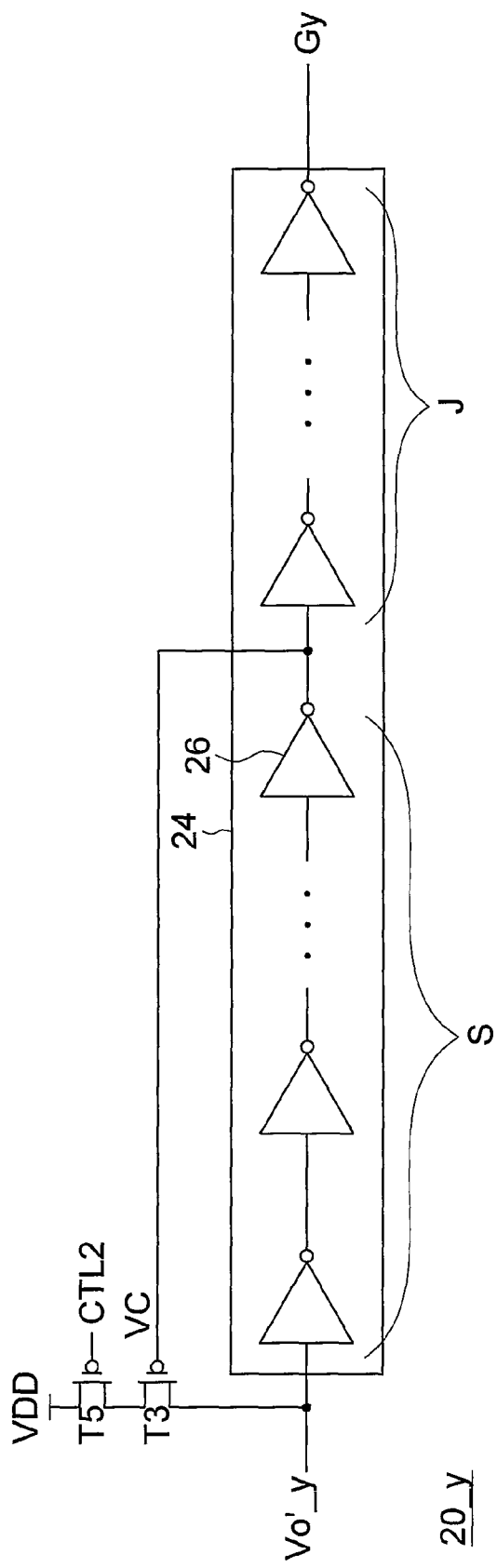
FIG. 13 is another circuit diagram showing the output stage circuit 20_y according to the second embodiment of the invention.

Similarly, one switch T5 for controlling pull-up is added, and the on/off state of the switch T5 is determined by the control signal CTL2, as shown in FIG. 13. Similar to the first embodiment, it is possible to prevent the instantaneous DC current loss caused when Vo_y is changed from the high potential to the low potential.

Third Embodiment

Figure 8:
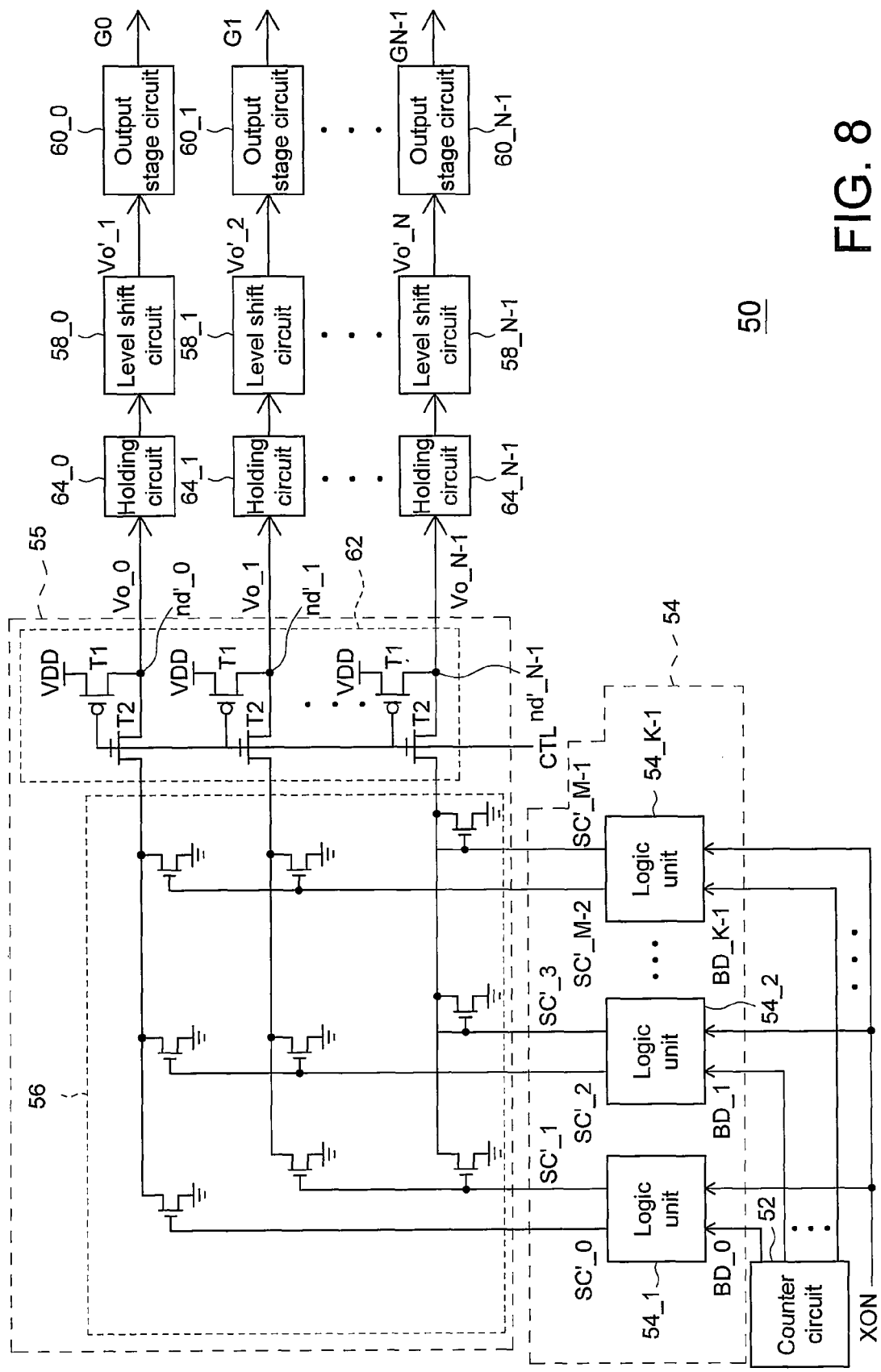
FIG. 8 is a block diagram showing a scan driver according to the third embodiment of the invention.

This embodiment provides a scan driver implemented by a dynamic decoder of an NOR-plane circuit formed by low voltage processes. FIG. 8 is a block diagram showing a scan driver 50 according to a third embodiment of the invention. Referring to FIG. 8, the difference between the scan driver 50 of this embodiment and the scan driver 10 of the first embodiment is that a dynamic decoder 55 of the scan driver 50 has an NOR-plane circuit 56 having N(=256) rows of transistors arranged is constructed with an NOR-column circuit structure. Each row of transistors includes K(=8) transistors connected in parallel, wherein the first terminals of the 8 transistors are connected to the output terminals of each row of transistors, and the second terminals of the 8 transistors receive the grounding level. Because the rows of transistors of the NOR-plane circuit 56 have substantially the same operation, the operation of the $z^{th}$ row of transistors of the NOR-plane circuit 56 will be described in the following example, wherein "z" is an integer greater than or equal to 0 and smaller than 256.

The NOR-plane circuit is normally implemented by N-type MOS. It could be changed to be implemented by P-type MOS with logical changed too. Or the NOR-plane can be said as the parallel connection with a plurality of transistors.

The $z^{th}$ row of transistors includes 8 transistors, which are respectively controlled by 8 control signals of the control signals SC_0 to SC_255 to turn on or off in the evaluation period T_E. The $z^{th}$ row of transistors equivalently forms an opened path when the value of the count data is equal to "z" so that the voltage signal Vo_z on the corresponding node nd_z may be kept at the level VDD. When the value of the count data is not equal to z, the $z^{th}$ row of transistors equivalently forms a grounding circuit to pull the level of the voltage signal Vo_z on the node nd_z down to the grounding level.

Figure 9:
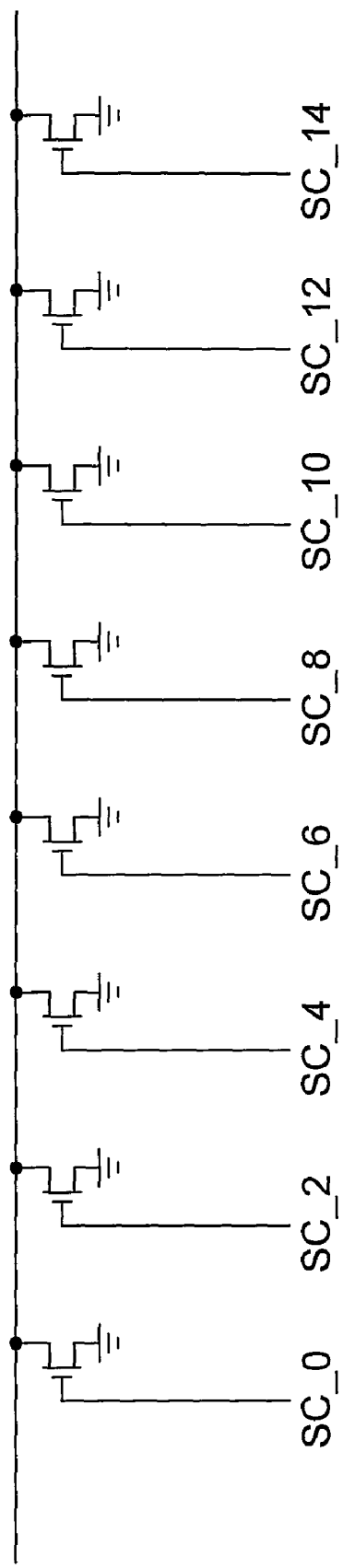
FIG. 9 is a circuit diagram showing a zeroth row of transistors in an NOR-planer circuit 56 of FIG. 8.

For example, "z" is equal to 0, and the zeroth row of transistors forms an opened path when the value of the count data is equal to $[00000000]_2$. The serially connected transistors of the zeroth row of transistors include the transistors having the gates for receiving the bit data BD'_1 to BD'_7. That is, the zeroth row of transistors is a circuit formed by 8 transistors whose gates receive the control signals SC'_0, SC'_2, SC'_4, SC'_6, SC'_8, SC'_10, SC'_12 and SC'_14, as shown in FIG. 9. Consequently, the zeroth row of transistors forms an opened path when the value of the count data is equal to 0 so that the level of the voltage signal Vo_0 on the node nd'_0 is held at the level VDD. When the value of the count data is not equal to 0, at least one transistor of the zeroth row of transistors is turned on so that the zeroth row of transistors forms a grounding path so pull the level of the voltage signal Vo_0 on the node nd'_0 down to the grounding level.

In the descriptions mentioned hereinabove, "z" is equal to 0. However, when "z" is equal to any other value ranging from 1 to 255, the corresponding first to $255^{th}$ rows of transistors may also perform the operations substantially similar to those of the zeroth row of transistors so as to correspondingly hold the levels of the nodes nd'_1 to nd'_255 at the level VDD. As can be understood from the above-mentioned descriptions, only one voltage signal is held at the level VDD in one evaluation period T_E. The output stage circuits 60_0 to 60_255 of this embodiment do not have the property of the inverse output, but directly output the voltage signals Vo'_0 to Vo'_255 as the high level enable scan signals.

In this illustrated embodiment, the voltage setting circuit 62 in the dynamic decoder 55 and the voltage setting circuit 22 of the first embodiment have substantially the same structure. However, the transistor T2 may also be omitted from the voltage setting circuit 62 of this embodiment while only the transistor T1 is kept. In addition, a logic unit circuit 54 for computation is added for the control signal CTL of the first example and may be implemented by a low-voltage device. The holding circuit is the same as that of the first embodiment.

In summary, compared with the conventional scan driver, the scan driver 50 of this embodiment also advantageously has the fewer transistors for the decoder, the smaller circuit area and the lower cost.

Fourth Embodiment

Figure 10:
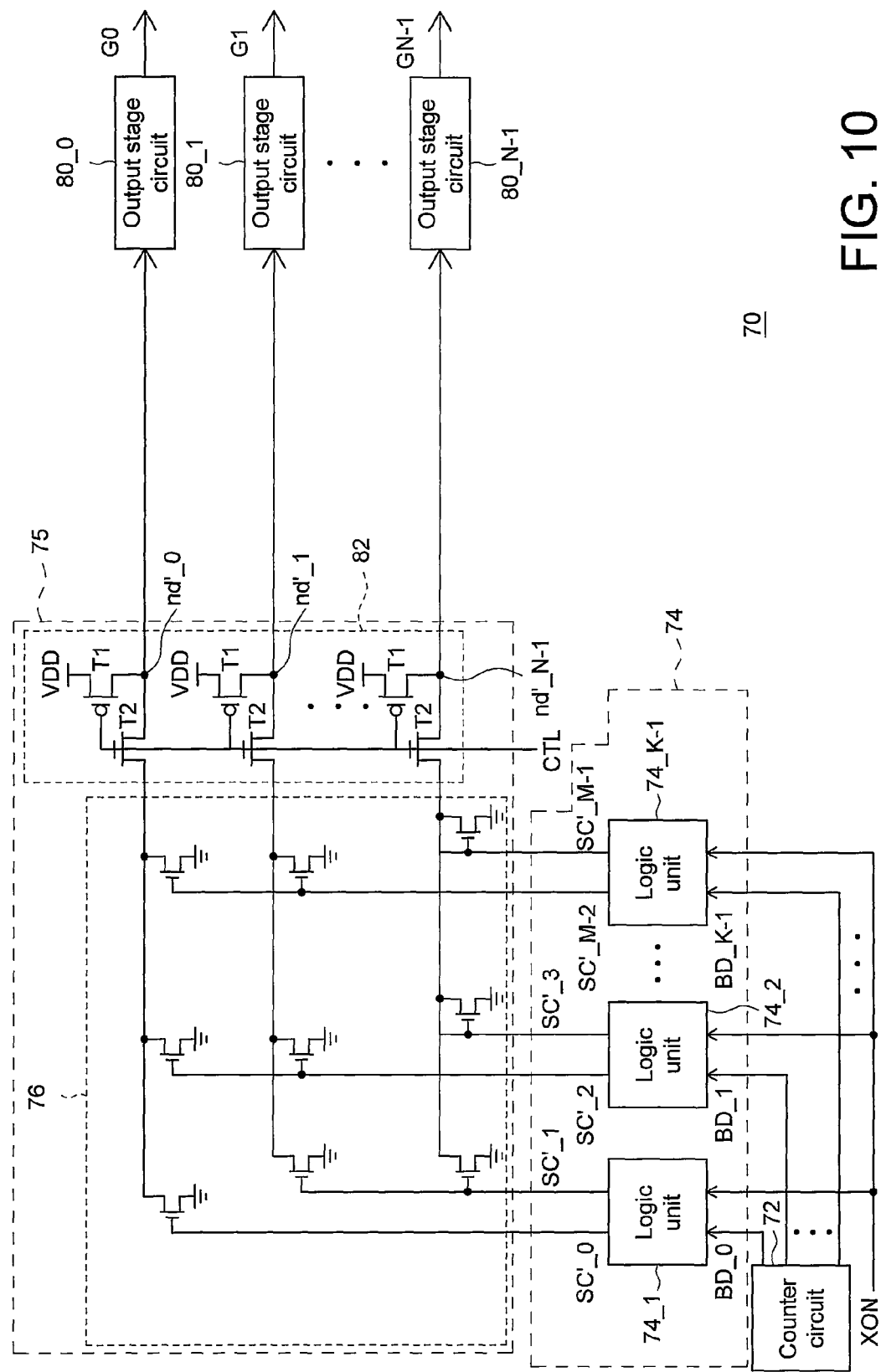
FIG. 10 is a block diagram showing a scan driver according to the fourth embodiment of the invention.

This embodiment provides a scan driver implemented by a dynamic decoder of an NOR-plane circuit formed by high-voltage manufacturing processes. FIG. 10 is a block diagram showing a scan driver 70 according to a fourth embodiment of the invention. As shown in FIG. 10, the difference between the scan driver 70 of this embodiment and the scan driver 50 of the third embodiment is that the level shift circuits are integrated in a logic circuit 74 in this scan driver 70 of the embodiment. Consequently, the logic circuit 74, a dynamic decoder 75, which includes an NOR-plane circuit 76 and a voltage setting circuit 82, and output stage circuits 80_0 to 80_255 of this embodiment are circuits formed by the high-voltage manufacturing processes. Compared with the scan driver 50 of the third embodiment, the circuit area may further be reduced in the scan driver 70 of this embodiment. Compared with the conventional scan driver, the scan driver 70 of this embodiment also advantageously has the fewer transistors for the decoder, the smaller circuit area and the lower cost. The holding circuit is the same as that of the second embodiment.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A scan driver, comprising:
a counter circuit for generating count data, the count data comprising K bit data, a value of the count data being increased by 1 or being changed every one fixed period, wherein K is a natural number;
a first logic circuit for receiving the K bit data and correspondingly generating M first control signals, wherein M is a natural number greater than K;
a dynamic decoder, which comprises:
N nodes, corresponding to the N output terminals;
a voltage setting circuit for setting N first voltage signals on the N nodes substantially to a first level in a precharge period; and
a plurality of first transistors, which is arranged to form N rows of transistor circuits connected to the respective N nodes, and is further arranged to form M columns of transistor circuits, wherein the M columns of transistor circuits are controlled by the respective M first control signals in an evaluation period to determine levels of the N first voltage signals;
N level shift circuits for lifting the levels of the N first voltage signals to generate respective N second voltage signals; and
N output stage circuits for receiving the respective N second voltage signals and outputting respective N gate signals.

2. The scan driver according to claim 1, further comprising N holding circuits, input terminals of the N holding circuits connected to the respective N nodes, and output terminals of the N holding circuits connected to input terminals of the respective N level shift circuits.

3. The scan driver according to claim 1, wherein the first transistors in each of the N rows of transistor circuits are connected in series, and the N rows of transistor circuits have first terminals connected to the respective N nodes via the voltage setting circuit, and second terminals for receiving a second level.

4. The scan driver according to claim 1, wherein each first transistor in one of the N rows of transistor circuits has a first input terminal connected to a corresponding node among the N nodes via the voltage setting circuit, and a second input terminal for receiving a second level.

5. The scan driver according to claim 1, wherein the voltage setting circuit comprises N second transistors having first input terminals connected to the respective N nodes, second input terminals for receiving a reference voltage, and control terminals for receiving a second control signal, wherein the N second transistors are turned on by the second control signal in the precharge period to provide the reference voltage to the respective N nodes.

6. The scan driver according to claim 5, wherein the voltage setting circuit further comprises N third transistors having first input terminals connected to the respective N nodes, second input terminals connected to N terminals of the respective N rows of transistor circuits, and control terminals for receiving the second control signal, wherein the N third transistors are turned on by the second control signal in the evaluation period to connect the respective N nodes to N respective terminals of the N rows of transistor circuits.

7. The scan driver according to claim 5, wherein the second control signal is a gate output enable (GOE) signal of the scan driver.

8. The scan driver according to claim 1, wherein each of the N output stage circuits comprises:
an inverter serial connection circuit, comprising a plurality of stage inverters, wherein an input terminal of a first stage inverter receives a corresponding one of the second voltage signals provided by a corresponding one of the N level shift circuits, wherein an output terminal of an ith stage inverter provides a third control signal, the third control signal and the second voltage signal have substantially inverse phases, and "i" is an odd number; and
a fourth transistor for holding a level of the second voltage signal in response to the third control signal,
wherein an output terminal of a last stage inverter of the inverter serial connection circuit is for outputting a corresponding one of the N gate signals.

9. The scan driver according to claim 8, wherein each of the N output stage circuits further comprises a fifth transistor connected to the fourth transistor in series, wherein the fifth transistor is controlled by a fourth control signal.

10. The scan driver according to claim 1, further comprising a function circuit for setting the N first voltage signals to a specific level in an all-on period so that the N gate signals are all-on.

11. The scan driver according to claim 1, wherein the first logic circuit is further for enabling the M columns of the first transistors to set the N first voltage signals to a specific level in an all-on period in response to a fifth control signal so that the N gate signals are all-on.

12. The scan driver according to claim 1, wherein the count data has a Gray code format.

13. The scan driver according to claim 1, wherein:
M is equal to 2K, and the M first control signals comprise the K bit data and K inverse bit data;
each of the M columns of transistor circuits comprises 2(K−1) transistors; and
N is equal to $2^K$, and each of the N rows of transistor circuits comprises K transistors.

14. A scan driver, comprising:
a counter circuit for generating count data, the count data comprising K bit data, a value of the count data being increased by 1 or being changed every one fixed period, wherein K is a natural number;
a first logic circuit for receiving the K bit data and correspondingly generating M first control signals, wherein M is a natural number greater than K;
a dynamic decoder, which comprises:
N nodes, corresponding to the N output terminals,
a voltage setting circuit for setting N first voltage signals on the N nodes substantially to a first level in a precharge period,and
a plurality of first transistors, which is arranged to form N rows of transistor circuits connected to the respective N nodes, and is further arranged to form M columns of transistor circuits, wherein the M columns of transistor circuits are controlled by M control signals output from the first logic circuit in an evaluation period to determine levels of the N first voltage signals; and
N output stage circuits for receiving N voltage signals that are obtained from the N first voltage signals and outputting respective N gate signals.

* * * * *

UNITED STATES PATENT AND TRADEMARK OFFICE
CERTIFICATE OF CORRECTION

PATENT NO. : 8,159,271 B2
APPLICATION NO. : 12/271063
DATED : April 17, 2012
INVENTOR(S) : Ching-Ho Hung It is certified that error appears in the above-identified patent and that said Letters Patent is hereby corrected as shown below:

Title Page, Item 73 (Assignee)

"Novtek Microelectronics Corp." should be changed to --Novatek Microelectronics Corp.--

Signed and Sealed this
Third Day of July, 2012

David J. Kappos
*Director of the United States Patent and Trademark Office*